United States Patent [19]

Smothers et al.

[11] Patent Number: 4,996,120
[45] Date of Patent: Feb. 26, 1991

[54] HOLOGRAPHIC PHOTOPOLYMER COMPOSITIONS AND ELEMENTS CONTAINING A RING-OPENING MONOMER

[75] Inventors: William K. Smothers, Hockessin; Bruce M. Monroe; Dominic M. Chan, both of Wilmington, all of Del.

[73] Assignee: E. I. DuPont de Nemours and Company, Wilmington, Del.

[21] Appl. No.: 524,228

[22] Filed: May 16, 1990

Related U.S. Application Data

[62] Division of Ser. No. 291,582, Dec. 19, 1988.

[51] Int. Cl.⁵ .............................................. G03H 1/04
[52] U.S. Cl. .......................................... 430/2; 430/1; 430/281; 350/3.61
[58] Field of Search .................... 430/1, 2, 281, 290; 350/3.61

[56] References Cited

U.S. PATENT DOCUMENTS

| | | | |
|---|---|---|---|
| 3,658,526 | 4/1972 | Haugh | 430/1 |
| 4,287,277 | 9/1981 | Matsumoto et al. | 350/3.61 |
| 4,321,406 | 3/1982 | Fayter, Jr. | 430/287 |
| 4,908,285 | 3/1990 | Kushibiki et al. | 430/1 |
| 4,913,990 | 4/1990 | Rallison | 430/1 |
| 4,942,112 | 7/1990 | Monroe et al. | 430/2 |

OTHER PUBLICATIONS

"Conversion of Vinylcyclopropane to Cyclopentenes", *Advanced Organic Chemistry*, J. March, McGraw-Hill Book Co., NY, 1977, pp. 1043–1044.

Primary Examiner—Marion C. McCamish
Assistant Examiner—Christopher D. RoDee

[57] ABSTRACT

Presence of a ring opening monomer polymerizable by free radical sigma-bond cleavage in a photopolymerizable composition improves volume reflection holograms prepared from the composition.

29 Claims, 2 Drawing Sheets

HOLOGRAPHIC PHOTOPOLYMER COMPOSITIONS AND ELEMENTS CONTAINING A RING-OPENING MONOMER

RELATED APPLICATIONS

This application is a division of application Ser. No. 291,582, filed Dec. 29, 1988.

FIELD OF THE INVENTION

This invention relates ;to imaging systems in which the imaged layer contains image areas having an index of refraction which is different from that of non-image areas. More particularly this invention relates to such systems wherein the refractive index image is a reflection hologram.

BACKGROUND OF THE INVENTION

The term "image recording" is conventionally taken to mean a process which produces a spatial pattern of optical absorption in the recording medium. Photographic processes are well known examples of this type of process.

In a broader sense, however, the word "image⇌ means a spatial variation of the optical properties of a sample in such a way as to cause a desired modification of a beam of light passing through, or reflecting from the sample. Refractive index images in general and holograms in particular, which modulate the phase, rather than the amplitude, of the beam passing through them are usually referred to as phase holograms. Phase holographic image recording systems produce a spatial pattern of varying refractive index rather than optical absorption in the recording medium and, thus, modulate a beam of light without absorbing it. This type of refractive index image formation includes a number of optical elements or devices, such as holographic lenses, gratings, mirrors, and optical waveguides, which superficially bear little resemblance to absorption images.

Holography is a form of optical information storage. The general principles are described in a number of references, e.g., "Photography by Laser" by E. N. Leith and J. Upatnieks in *Scientific American*, 212, No. 6,24–35 (June, 1965). A useful discussion of holography is presented in "Holography", by C. C. Guest, in *Encyclopedia of Physical Science and Technology*, Vol. 6, pp. 507–519, R. A. Meyers, Ed., Academic Press, Orlando, Fla., 1997. In brief, the object to be photographed or imaged is illuminated with coherent light (e.g., from a laser) and a light sensitive recording medium (e.g., a photographic plate) is positioned so as to receive light reflected from the object. This beam of reflected light is known as the object beam. At the same time, a portion of the coherent light is directed to the recording medium, bypassing the object. This beam is known as the reference beam. The interference pattern that results from the interaction of the reference beam and the object beam impinging on the recording medium is recorded in the recording medium. When the processed recording medium is subsequently appropriately illuminated and observed at the appropriate angle, the light from the illuminating source is diffracted by the interference pattern recorded in the recording medium to reconstruct the wavefront that originally reached the recording medium from the object. Thus, the hologram resembles a window through which the virtual image of the object is observed in full three-dimensional form, complete with parallax.

Holograms that are formed by allowing the reference and object beams to enter the recording medium from the same side are known as transmission holograms. Interaction of the object and reference beams in the recording medium forms fringes of material with varying refractive indices, which are approximately normal to the plane of the recording medium. When the hologram is played back by viewing with transmitted light, these fringes refract the light to produce the viewed virtual image. Such transmission holograms may be produced by methods which are well known in the art, such as disclosed in Leith and Upatnieks, U.S. Pat. Nos. 3,506,327; 3,838,903 and 3,894,787. A diffraction grating is the simplest possible transmission hologram. It is the hologram of two coherent plane waves. It can be created by splitting a single laser beam and recombining the beams at the recording medium.

Holograms formed by allowing the reference and object beams to enter the recording medium from opposite sides, so that they are travelling in approximately opposite directions, are known as reflection holograms. Interaction of the object and reference beams in the recording medium forms fringes of material with varying refractive indices which are, approximately, in planes parallel to the plane of the recording medium. When the hologram is played back these fringes act as partial mirrors reflecting incident light back to the viewer. Hence, the hologram is viewed in reflection rather than in transmission. Since the wavelength selectivity of this type of hologram is very high, white light may be used for reconstruction.

Reflection holograms may be produced by an on-axis method wherein the beam of coherent radiation is projected through the recording medium onto an object therebehind. In this instance, the reflected object beam returns and intersects with the projected beam in the plane of the recording medium to form fringes substantially parallel to the plane of the medium. Reflection holograms also may be produced by an off-axis method wherein a reference beam is projected on one side of the recording medium and an object beam is projected on the reverse side of the medium. In this instance the object beam is formed by illuminating the object with coherent radiation which has not passed through the recording medium. Rather, the original beam of coherent radiation is split into two portions, one portion being projected on the medium and the other portion being directed to project on the object behind the medium. Reflection holograms produced by an off-axis process are disclosed in U.S. Pat. No. 3,532,406.

A holographic mirror is the simplest possible reflection hologram. It is the hologram of two coherent plane waves intersecting in a recording medium from substantially opposite directions. It can be created by splitting a single laser beam and recombining the beams at the recording medium, or the unsplit laser beam can be projected through the medium onto a plane mirror therebehind. A set of uniformly spaced fringes are formed that have a sinusoidal-like intensity distribution. The fringes are oriented parallel to the bisector of the obtuse angle between the two beams propagating in the recording medium. If the obtuse angle is 180° and the beams are normal to the plane of the medium, the fringes will be parallel to the plane of the medium. If the two beams do not make equal angles ;with the normal to the plane of the medium, then the fringes which are formed will be slanted at an acute angle relative to the plane of the medium. The holographic mirror can be characterized by its wavelength of maximum refection and by its reflection efficiency, that is, by the percent of incident radiation which is reflected at its wavelength of maximum reflection.

The substantially horizontal fringes which form reflection holograms are much more difficult to record than the perpendicular fringes which form transmission holograms for two reasons. The first reason is the need for higher resolution, i.e., the need for ore fringes per unit length, and thus a closer fringe spacing. Horizontal reflection holograms require about 3× to 6× more fringes per unit length than do transmission holograms. The second reason is the sensitivity of horizontal fringes to shrinkage of the recording medium during exposure. Any shrinkage of the recording medium during exposure will tend to wash out the fringes and, if severe, will prevent a hologram from being formed. This is in contrast to the transmission hologram case, where shrinkage has little or no effect when the fringes are perpendicular to the plane of the medium, and produces only relatively minor image distortion if the transmission fringes are slated more than 45° from the plane of the medium.

A variety of materials have been used to record holograms. Among the more important are: silver halide emulsions, hardened dichromated gelatin, ferroelectric crystals, photopolymers, photochromics and photodichroics. Characteristics of these materials are given in *Volume Holography and Volume Gratings*, by L. Solymar and D. J. Cook, Chapter 10, Academic Press, New York, 1981, pp. 254–304.

Dichromated gelatin is the material most widely used for recording holograms. This material has become the popular choice because of high diffraction efficiency and low noise characteristics. However, dichromated gelatin has poor shelf life and requires wet processing. Plates must be freshly prepared, or prehardened gelatin must be used. Wet processing means that an additional step is required in hologram preparation and may also cause the hologram to change due to swelling and then shrinkage of the gelatin during processing. Shrinkage may particularly be a problem when preparing reflection holograms in that the shrinkage will alter the wavelength of maximum reflection. The requirement that plates by freshly prepared each time a hologram is made plus the problems associated with wet processing make reproducibility extremely difficult to achieve with dichromated gelatin.

While early holograms where prepared from silver halide or dichromated colloids which required several processing steps, photopolymerizable elements have been proposed which require only a single process step. U.S. Pat. No. 3,658,526 to Haugh discloses preparation of stable, high-resolution holograms from solid, photopolymerizable layers by a single step-process wherein a permanent refractive index image is obtained by a single imagewise exposure of the photopolymerizable layer to actinic radiation bearing holographic information. The holographic image formed is not destroyed by subsequent uniform actinic exposure, but rather is fixed or enhanced.

Despite the many advantages of the solid photopolymerizable layers proposed by Haugh, reflection holograms produced therefrom have been poor at best, with little reflection efficiency. Thus, there is a need for improved compositions for the preparation of reflection holograms.

SUMMARY OF THE INVENTION

This invention provides storage stable, solid, photopolymerizable compositions which produce reflection holograms having improved reflection efficiency. Whereas reflection efficiencies of prior art solid formulations typically are 10% or less, reflection efficiencies as high as 30% can readily be achieved using the compositions of this invention. Resulting holograms not only are brighter, but have broader viewing angles since the improved reflection efficiency permits use of a thinner coating of the photopolymer composition.

More particularly, in one embodiment this invention provides a substantially solid, photopolymerizable composition that forms a reflection hologram upon exposure to actinic radiation as the sole processing step, said composition consisting essentially of:

(a) 25 to 75% of a solvent soluble, thermoplastic polymeric binder;

(b) 5 to 60% of a monomer capable of addition polymerization, said monomer having a boiling point above 100° C. and polymerizing via ring-opening sigma-bond cleavage;

(c) 0.1 to 10% of a photoinitiator system that activates polymerization of said monomer on exposure to actinic radiation;

wherein said percentages are weight percentages of the total composition. As used herein the term "actinic radiation" refers to a coherent light source, such as that produced by a laser.

Preferred monomers contain a ring selected from the group consisting of carbocyclic rings of three carbon atoms and heterocyclic rings of up to five atoms containing up to two heteroatoms, wherein said heteroatoms are selected from the group consisting of nitrogen, oxygen, and sulfur. Vinylcyclopropanes, and especially vinylcyclopropanes which contain an unsubstituted vinyl group (i.e. a $H_2C=CH-$ group), attached to the cyclopropane ring, ad in which the ring is substituted with one or more electron-withdrawing groups, are preferred. Ethyl 1-acetyl-2-vinyl-1-cyclopropane carboxylate, ethyl 1-benzoyl-2-vinyl-1-cyclopropane carboxylate, and ethyl 2-vinylcyclopropane-1,1-dicarboxylate are particularly useful monomers.

In a preferred mode the initiator system is a 2,4,5-triphenylimidazolyl dimer, or a mixture of dimers, and a hydrogen donor, sensitized by a visible sensitizer. Preferred 2,4,5-triphenylimidazolyl dimers included CDM-HABI, o-CI-HABI and TCTM-HABI. Sensitizers that may be used to advantage include the bis(p-dialkylaminobenzylidine) ketones, disclosed in Baum and Henry, U.S. Pat. No. 3,652,275 and the arglidene aryl ketones disclosed in Dueber, U.S. Pat. No. 4,162,162, as well as in U.S. Pat. Nos. 4,268,667 and 4,351,893.

The photopolymerizable composition typically will be coated or laminated onto a suitable substrate, such as polyethylene terephthalate, to form an element that may be imaged to form a hologram.

DETAILED DESCRIPTION OF THE INVENTION

Figure 1:
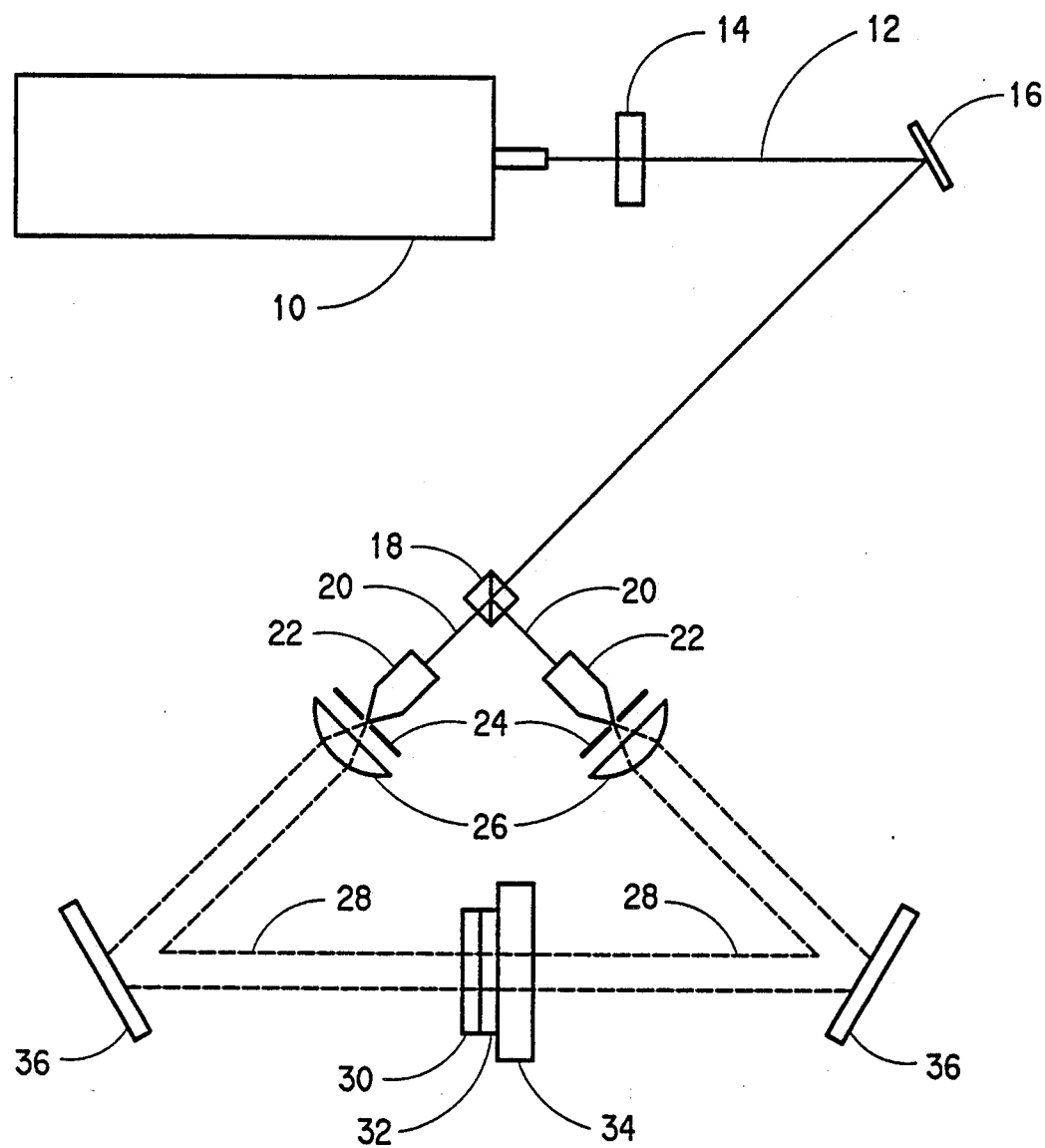
FIG. 1 illustrates the experimental arrangement used to prepare holographic mirrors.

The improved photopolymerizable compositions of this invention are substantially solid and are typically used as a layer applied to a permanent substrate. The photopolymerizable layer is a thermoplastic composition which, upon exposure to actinic radiation, forms polymers of higher molecular weight that change the refractive index and rheological character of the composition. Free radical addition polymerization and/or crosslinking of a compound containing one or more ethylenically unsaturated groups, usually in a terminal position, hardens and insolubilizes the composition. The sensitivity of the photopolymerizable composition is enhanced by the photoinitiator system that may contain a component that sensitizes the composition to practical radiation sources, e.g., visible light.

While the photopolymerizable layer is a solid sheet of uniform thickness it is composed of at least three major components: a substantially solid, solvent soluble, thermoplastic polymeric binder; at least one monomer capable of addition polymerization, said monomer having a boiling point above 100° C. and polymerizing via ring-opening sigma-bond cleavage; and a photoinitiator system activatible by actinic radiation. Although the layer is a solid composition, components may interdiffuse before, during and after imaging exposure until they are fixed or destroyed by a final uniform treatment, usually by a further uniform exposure to actinic radiation or by thermal treatment at elevated temperatures. Interdiffusion may be further promoted by incorporation into the composition of an otherwise unreactive plasticizer. Typically, the composition contains a liquid monomer, but it may contain solid monomer components, either individually or in combination with one or more liquid monomers, which are capable of interdiffusing in the solid composition and reacting to form a polymer or copolymer with a refractive index shifted from that of the preformed polymeric material.

Monomers

Despite the many advantages of the solid photopolymerizable layers disclosed in Haugh, U.S. Pat. No. 3,658,526, reflection holograms produced therefrom have been poor at best, with little or no reflection efficiency. These layers contain addition-polymerizable, nongaseous, ethylenically unsaturated monomers capable of forming high polymers by free radical initiated, chain-propagating addition polymerization; a free radical generating system activatible by actinic radiation; and, in the preferred case, a macromolecular organic binder that is solid at 50° C. and compatible with said monomer. The preferred binder is cellulose acetate butyrate.

In the compositions of the instant invention, monomers are selected which polymerize via ring-opening, sigma-bond cleavage. When used in stable, solid, photopolymerizable compositions, these monomers produce bright and sharp reflection holograms with good reflection efficiency. Monomers useful in the practice of this invention are those having a boiling point above 100° C. and which polymerize via a ring-opening sigma-bond cleavage. These monomers may be liquid, or they may be solid if the solid monomer can be dissolved in a liquid monomer or monomers and/or a liquid plasticizer or plasticizers or mixtures thereof.

Ring-opening polymerizations has been discussed in *Ring-Opening Polymerization*, K. J. Ivin and T. Saegusa, ed., Elsevier, New York, 1984, especially Chapter 1, "General Thermodynamic and Mechanistic Aspects of Ring-opening Polymerization" by K. J. Ivin and T. Saegusa, pp. 1–82, and Chapter 2, "Ring-opening Polymerizations via Carbon-Carbon Sigma-Bond Cleavage", by H. K. Hall, Jr., and L. G. Snow, pp. 83–119; by W. J. Bailey et al., *J. Macromol. Sci. Chem.*, A21, 1611–1639, 1984; and by I. Cho and K. D. Ahn, *J. Poly. Sci. Poly. Lett. Ed.* 15, 751–753, 1977, Polycyclic ring opened polymers are discussed in Bailey, U.S. Pat. No. 4,387,215. As will be appreciated by those skilled in the art, a sigma-bond is a single bond, i.e., one which, to a first approximation, involves only one pair of shard electrons.

Monomers that may be selected are those in which the ring which is opened on polymerization, selected from the group consisting of carbocyclic rings with seven or fewer carbon atoms and heterocyclic rings of seven or fewer atoms containing up to two heteroatoms wherein said heteroatoms are selected from the group consisting of nitrogen, oxygen, and sulfur. Suitable monomers, which can be used as the sole monomer or in combination with other monomers of this type or which can be mixed with conventional monomers and/or plasticizers, include: vinylcyclopropanes, such as 1,1-dicyano-2-vinylcyclopropane, 1,1-dichloro-2-vinylcyclopropane, diethyl 2-vinylcyclopropane-1,1-dicarboxylate (EVCD), ethyl 1-acetyl-2- vinyl-1-cyclopropane carboxylate (EAVC), ethyl 1-benzoyl-2-vinyl-1-cyclopropane carboxylate (EBVC) and the like; bicyclobutanes, especially those which contain one or more electron-withdrawing groups at the bridgehead positions, such as dimethyl bicyclobutane-1,3-dicraboxylate, and the like; tetramethylene disulfide; spiro-de-o-xylylene; unsaturated o-carbonates, such as 2-methylene-1,3-dioxolane; and unsaturated spiro o-carbonates, such as 3,9-bis(methylene)-1,5,7,11-tetraoxaspiro[5,5]undecane. Electron-withdrawing groups that promote sigma bond cleavage are substituents such as carboethoxy, cyano, acetyl, benzoyl, and the like, which have positive substituent constants, or rho values, as measured by the well-known Hammett equation (see, for example, *Physical Organic Chemistry*, by L. P. Hammett, McGraw-Hill, New York, 1940, Chapter 7, pp. 184–227, or *Physical Organic Chemistry*, by J. Hine, McGraw-Hill, New York, 2nd., 1962, Chapter 4, pp. 81–103).

Preferred monomers contain a ring which si selected from the group consisting of carbocyclic rings of three carbon atoms and heterocyclic rings of up to five atoms containing up to two heteroatom wherein said heteroatoms are selected from the group consisting of nitrogen, oxygen, and sulfur. Vinylcyclopropanes, and especially vinylcyclopropanes which contain an unsubstituted vinyl group (i.e., a $H_2C=CH-$ group) attached to the cyclopropane ring, and in which the ring, is substituted with one or ore electron-withdrawing groups, are preferred. Particularly useful monomers are: diethyl 2-vinylcyclopropane-1,1-dicarboxylate (EVCD); ethyl 1-acetyl-2-vinyl-1-cyclopropane carboxylate (EAVC); and ethyl 1-benzoyl-2-vinyl-1-cyclopropane carboxylate (EBVC); which have the following structures;

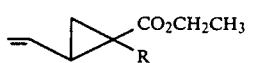

```
EVCD R = —CO₂CH₂CH₃
EAVC R = —COCH₃
EBVC R = —COC₆H₅
```

Binder

The binder serves as a containing medium for the monomer, photoinitiator, and other components prior to exposure; provides the base line refractive index; and, after exposure, contributes to the physical and refractive index characteristics needed for the reflection hologram or refractive index image formed. Cohesion, adhesion, flexibility, miscibility, tensile strength, in addition to index of refraction, are some of the many properties which determine if the binder is suitable for use in a refractive index recording medium.

Useful binders are preformed macromolecular polymeric or resin materials, typically having a molecular weight above 1000, including the following: polymers and copolymers of acrylate and alpha-alkyl acrylate esters, e.g., polymethyl methacrylate and polyethyl methacrylate; polymers and copolymers of vinyl esters and their hydrolysis and partial hydrolysis products, e.g., polyvinyl acetate, polyvinyl acetate/acrylate, polyvinyl acetate/methacrylate and hydrolyzed polyvinyl acetate; ethylene/vinyl acetate copolymers; styrene polymers and copolymers, with, e.g., maleic anhydrides, or acrylate and methacrylate esters; vinylidene chloride copolymers, e.g., vinylidene chloride/acrylonitrile, vinylidene chloride/methacrylate, and vinylidene chloride/vinyl acetate; vinyl chloride polymers and copolymers, e.g., vinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene and styrene/isoprene/styrene block copolymers; poly(ethylene imine); polyepoxides having average molecular weights from about 4,000 to 1,000,000; copolyesters, e.g., those prepared from the reaction product of a polymethylene glycol of the formula HO(CH₂)ₙOH, where n is an integer of from 2 to 10 inclusive, with (1) hexahydroterephthalic, sebacic and terephthalic acids, (2) terephthalic, isophthalic and sebacic acids, (3) terephthalic and sebacic acids, (4) terephthalic and isophthalic acids, or (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetals, e.g., polyvinyl butyral, polyvinyl formal; polyformaldehydes; poly N-vinyl carbazole and copolymers thereof; and carbazole containing polymers such as those disclosed by H. Kamogawa et al., *J. Poly. Sci., Poly. Chem. Ed.*, 18, 9–18, 1979.

In the preferred stable, solid, photopolymerizable compositions adapted for the preparations of holograms, the binder and the monomer are selected so that either the binder or the monomer contains one or more moieties selected from the group consisting of substituted or unsubstituted phenyl, phenoxy, naphthyl, naphthyloxy, and heteroaromatic groups containing up to three aromatic rings; chlorine; and bromine. The other component is substantially free of these specified moieties. In the instance when the monomer contains these moieties, the photopolymerizable system hereinafter is identified as a "Monomer Oriented System" and when the polymeric material contains these moieties, the photopolymerizable system hereinafter is identified as a "Binder Oriented System".

The monomer of a Monomer Oriented System of this invention is a compound capable of addition polymerization via carbon-carbon sigma-bond cleavage and having boiling point above 100° C. which contains one or more moieties taken from the group consisting of a substituted or unsubstituted phenyl, phenoxy, naphthyl, naphthyloxy, and heteroaromatic groups containing up to three aromatic rings; chlorine; and bromine. The monomer contains at least one such moiety and may contain two or more of the same or different moieties of the group. A preferred monomer of this invention for use in the Monomer Oriented System is ethyl 1-benzoyl-2-vinyl-1-cyclopropane carboxylate (EBVC).

The solvent soluble polymeric material or binder of the Monomer Oriented System in substantially free of substituted or unsubstituted phenyl, phenoxy, naphthyl, naphthyloxy, and heteroaromatic groups containing up to three aromatic rings; chlorine; and bromine. Candidate binders of this class, which are solvent soluble, ,thermoplastic polymers, which can be used alone, or in combination with one another and include the following: acrylate and alpha-alkyl arcylate ester and include the following: acrylate and alpha-alkyl acrylate ester and acid polymers and interpolymers e.g. polymethyl methacrylate and polyethyl methacrylate; polyvinyl esters, e.g. polyvinyl acetate, polyvinyl acetate/acrylate, polyvinyl acetate/methacrylate and hydrolyzed polyvinyl acetate; ethylene/vinyl acetate copolymers; saturated and unsaturated polyurethanes; butadiene and isoprene polymers and copolymers and high molecular weight polyethylene oxides of polyglycols having average molecular weights from about 4,000 to 1,000,000; epoxides, e.g., epoxides containing acrylate or methacrylate groups; polyamides, e.g., N-methoxymethyl polyhexamethylene adipamides, cellulose esters, e.g., cellulose acetate, cellulose acetate succinate and cellulose acetate butyrate; cellulose ethers, e.g., methyl cellulose, and ethyl cellulose, polycarbonates; polyvinyl acetal, e.g., polyvinyl butyral, polyvinyl formal; polyformaldehydes. Acid containing polymers and copolymers functioning as suitable binder include those disclosed in U.S. Pat. No. 3,458,311 and in U.S. Pat. No. 4,273,857 as well as the amphoteric polymeric binders disclosed in U.S. Pat. No. 4,293,635.

Particularly preferred binders for use in the Monomer Oriented System of this invention are cellulose acetate butyrate polymers; acrylic polymers and inter polymers including polymethyl methacrylate, methyl methacrylate/methacrylic acid and methyl methacrylate/acrylic acid copolymers, terpolymers of methylmethacrylate/$C_2$–$C_4$ alkyl acrylate or methacrylate/acrylic or methacrylic acid; polyvinyl acetate; polyvinyl acetal; polyvinyl butyral; and polyvinyl formal; as well as mixtures thereof.

The monomer of a Binder Oriented System of this invention is a compound capable of addition polymerization via carbon-carbon sigma-bond cleavage and having a boiling point above 100° C. which is substantially free of moieties taken from the group, consisting essentially of substituted or unsubstituted phenyl, phenoxy, naphthyl, naphthyloxy, and heteroaromatic groups containing up to three aromatic rings; chlorine; and bromine. Preferred monomers of this invention for use in the Binder Oriented System are diethyl 2-vinylcyclopropane-1,1-dicarboxylate (EVCD) and ethyl 1-acetyl-2-vinyl-1 cyclopropane carboxylate (EAVC).

The solvent soluble polymeric material or binder of the Binder Oriented System contains in its polymeric structure moieties taken from the group consisting essentially of substituted or unsubstituted phenyl, phenoxy, naphthyl, naphthyloxy, and heteroaromatic groups containing up to three aromatic rings; chlorine; and bromine. The moieties may form part of the monomeric units which constitute the polymeric binder or may be grafted onto a preformed polymer or interpolymer. The binder of this type may be a homopolymer or it may be an interpolymer of two or more separate monomeric units wherein at least one of the monomeric units contains one of the moieties identified above.

Candidate binders of this class which are solvent soluble, thermoplastic polymers or interpolymers can be used alone, or in combination with one another include the following: polystyrene polymers and copolymers, e.g., with maleic anhydride, acrylic acid, methacrylic acid and esters thereof; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; methacrylate/acrylonitrile/butadiene/styrene copolymers, 2-chlorobutadiene-1,3 polymers, chlorinated rubber, and styrene/butadiene/styrene, styrene/isoprene/styrene block copolymers; copolyesters, e.g., those prepared from the reaction product of a polymethylene glycol of the formula $HO(CH_2)_n$ pl OH, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and ispophthalic acids, and (5) mixtures of copolyesters prepared from said glycols and (i) terephthalic, isophthalic and sebacic acids and (ii) terephthalic, isophthalic, sebacic and adipic acids; cellulose ethers, e.g., ethyl benzyl cellulose; poly N-vinyl carbazole and copolymers thereof; and carbazole containing polymers such as those disclosed by H. Kamogawa et al., *J. Poly. Sci: Poly. Chem. Ed.*, 18, 9–18, 1979.

Particularly preferred binders for use in the Binder Oriented System include polystyrene, poly(styrene/acrylonitrile), poly(styrene/methyl methacrylate), and polyvinyl benzal as well as admixtures thereof.

Initiator Systems

By "actinic radiation" is meant radiation from a coherent light source, such as a laser, which is active to produce the free-radicals necessary to initiate polymerization of the monomeric material. The initiator system comprises one or more compounds which directly furnish free-radicals when activated actinic radiation. It can also comprise a plurality of compounds, one of which yields the free-radicals after having been caused to do so by another compound, or sensitizer, which is activated by the radiation. Photoinitiator systems useful in practicing this invention typically will contain a photoinitiator and a sensitizer which extends the spectral response into regions having special utility, e.g., the near ultraviolet region and the visible and near infrared spectral regions where lasers emit.

A large number of free-radical generating compounds can be utilized to advantage. Redox systems, especially those involving dyes, e.g., Rose Bengal/2-dibutylaminoethanol, may be used. Photoreducible dyes and reducing agents such as those disclosed in U.S. Pat. Nos. 2,850,445; 2,875,047; 3.097,096; 3,074,974; 3,097,097, 3,145,104; and 3,579,339; as well as dyes of the phenanzine, oxazine, and quinone classes can be used to initiate photopolymerization. A useful discussion of dye sensitized photopolymerization can be found in "Dye Sensitized Photopolymerization by D. F. Eaton in *Adv. in Photochemistry*, Vol. 13, D. H. Volman, G. S. Hammond, and K. Gollinick, eds. Wiley-Interscience, New York, 1986, pp. 427–487.

Preferred initiator systems are 2,4,5-triphenylimidazolyl dimers with chain transfer agents, or hydrogen donors, and mixtures thereof as described in U.S. Pat. Nos. 3,427,161; 3,479,185; 3,549,367; 4,311,783; 4,622,286; and 3,784,557, sensitized by visible sensitizers. Useful 2,4,5-triarylimidazolyl dimers are disclosed in Baum et al. U.S. Pat. No. 3,652,275 column 5, line 44 to column 7, line 16. Preferred 2,4,5-triphenylimidazolyl dimers include CDM-HABI, i.e., 2-(o-chlorophenyl)-4,5-bis(m-methoxyphenyl)-imidazole dimer; o-Cl-HABI, i.e., 1,1'-biimidazole, 2,2'-bis (o-chlorophenyl)-4,4',5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor.

Sensitizes useful with these photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidine) ketones disclosed in Baum et al., U.S. Pat. No. 3,652,275 and the arylyidene aryl ketones disclosed in Dueber, U.S. Pat. No. 4,162,162, as well as in U.S. Pat. Nos. 4,268,667 and 4,351,893. Useful sensitizers are listed in Dueber, U.S. Pat. No. 4,162,162 column 6, line 1 to line 65. Particularly preferred sensitizers include the following: DBC, i.e. cyclopentanone; 2,5-bis-[4-[(diethylamino)-2-methylphenyl]methylene]-; DEAW, i.e. cyclopentanone, 2,5-bis[4-diethylamino)phenyl]methylene]-; dimethoxy-JDI, i.e., 1H-iden-1-one, 2,3-dihydro-5,6-dimethoxy-2-[(2,3,6,7-tetrahydro-1H,5H-benzo[ij]quinolizin-9-yl)methylene]-; and JAW, i.e., cyclopentanone, 2,5-bis[(1H,5H-benzo[ij]quinolizin-1-yl)methylene]-, which have the following structures:

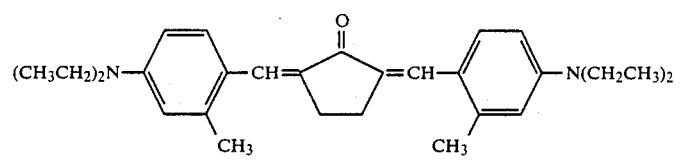

DBC

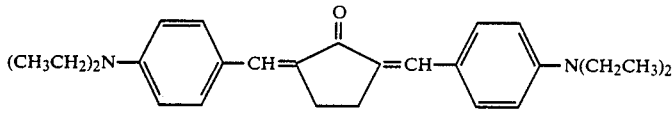

DEAW

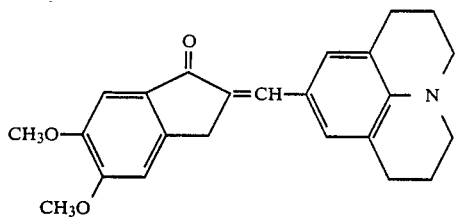

dimethoxy-JDI

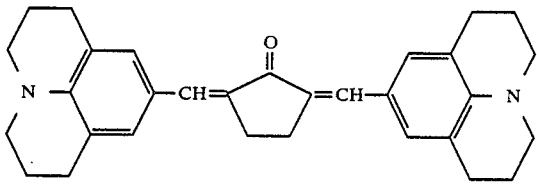

JAW

Hydrogen donor compounds useful as chain transfer agents in the photopolymer compositions include: 2-mercaptobenzoxazole, 2-mercaptobenzothiazole, 4-methyl-4H-1,2,4,triazole-3-thiol, and the like; as well as various types of compounds, e.g., (a) ethers, (b) esters, (c) alcohols, (d) compounds containing allylic or benzylic hydrogen, (e) acetals, (f) aldehydes, and (g) amides as disclosed in column 12, lines 18 to 58 of MacLachlan, U.S. Pat. No. 3,390,996. Other suitable hydrogen donor compounds, which are preferred for compositions which contain N-vinyl carbazole monomer, are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

Other Components

The solid photopolymerizable compositions of this invention may contain a plasticizer to enhance the refractive index modulation of the imaged composition. Plasticizers of this invention may be used in amounts varying from about 2% to about 25% by weight of the composition preferably 5 to about 15 wt. %. Suitable plasticizers include triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropylnaphthalene, diisopropylnaphthalene, poly(propylene glycol), glyceryl tributyrate, diethyl adipate, diethyl sebacate, dibutyl suberate, tributyl phosphate, tris(2-ethylhexyl) phosphate, Brij ® 30[$C_{12}H_{25}(OCH_2CH_2)_4OH$], and Brij ® 35 [$C_{12}H_{25}(OCH_2CH_2))_{20}OH$]. Particularly preferred plasticizers for use in these systems are triethylene glycol dicaprylate and tetraethylene glycol diheptanoate.

Other plasticizers that yield equivalent results will be apparent to those skilled in the art, and may be employed in accordance with the invention. In cases in which a mixture of a solid and a liquid monomer are present, it will also be appreciated that plasticizer may be substituted for some or all of the liquid monomer, provided that the mixture of plasticizer and monomer remains liquid. It will also be appreciated that a mixture of plasticizer and solid monomer may be used, provided that the mixture of plasticizer and monomer remains liquid.

Other conventional components, in addition to those described above, can present in the compositions and elements of this invention in varying amounts. Such components include: optical brighteners, ultraviolet radiation absorbing material, thermal stabilizers, and release agents.

Optical brighteners useful in the process of the invention include those disclosed in Held, U.S. Pat. No. 3,854,950. A preferred optical brightener is 7-(4'-chloro-6'-diethylamino-1',3',5'-triazine-4'-yl) amino 3-phenyl coumarin. Ultraviolet radiation absorbing materials useful in the invention are also disclosed in Held, U.S. Pat. No. 3,854,950.

Useful thermal stabilizers include: hydroquinone, phenidone, p-methoxyphenyl, alkyl and aryl-substituted hydroquinones and quinones, tert-butyl catechol, pyrogallol, copper resinate, naphthlamines, beta-naphthol, cuprous chloride, 2,6-di-tertbutyl p-cresol, phenothiazine, pyridine, nitrobenzene, dinitrobenzene, p-toluquinone and chloranil. The dinitroso dimers described in Pazos, U.S. Pat. No. 4,168,982, are also useful. Normally a thermal polymerization inhibitor will be present to increased stability in the storage of the photopolymerizable composition. A preferred reversible thermal stabilizer is TAOBN, i.e., 1,4,4-trimethyl-2,3-diazobicyclo(3.2.2)-non-2-ene-2,3-dioxide.

Compounds which have been found useful as release agents may also be incorporated in film compositions such as are described in Bauer, U.S. Pat. No. 4,326,010. A preferred release agent is polycaprolactone.

Exposure/Evaluation

In the process of this invention, reflection holograms are prepared using a substantially solid, photopolymerizable recording medium which comprises a transparent, dimensionally stable substrate having thereon a thin layer, typically between about 10 and 100 micrometers thick, of a unique, substantially solid, photopolymerizable composition.

In the instance of the "in-line" or "on-axis" mode of the process, a uniform, coherent beam of laser radiation, e.g., a collimated 488 nm argon-ion laser bean, is projected onto a first surface of the photopolymerizable layer typically at an angle of from 0° up to 70° form the normal to the plane of the layer. The collimated beam functions in part as a "reference beam" while a portion of the collimated beam which is transmitted through the layer and transparent substrate illuminates an object behind the layer. The portion of the transmitted laser radiation which is reflected by the object forms an "object beam" which projects back onto the rear second surface of the layer and interacts with the reference beam in the plane of the layer to form fringes which are oriented parallel to the bisector.

For the purpose of evaluating material useful in the process of this invention holographic mirrors are prepared and reflection efficiency and wavelength of maximum reflection are determined. A film element is prepared comprising, in order: a 0.1 mm thick clear polyethylene terephthalate film support; a photopolymerizable layer between about 0.01 to 0.05 mm thick, and polyethylene terephthalate cover sheet.

Coated film is cut into uniform sections, the cover sheet is removed, and the film then mounted by hand laminating the tacky coating directly a glass plate with a hand roller. Even though the layer is solid its surface typically is tacky and adheres readily to the glass surface. In those instances where tack is absent, heat and/or pressure may be used to eliminate the photopolymerizable layer to the glass substrate surface. Typically the film support is left in place on the laminate and serves to protect the layer during exposure and handling operations.

Holographic mirrors are formed by actinic exposure at the intersection of two counter propagating beams of an argon-ion laser operating at 488 nm, $TEM_{00}$ mode. This is achieved using the system illustrated in FIG. 1. In the system an argon ion laser (10) operating at 488 nm and $TEM_{00}$ produces a laser beam (12) which is controlled by a shutter (14). The laser beam (12) is directed by a mirror (16) into a beam splitter (18) wherein the beam is divided into two equal beam segments (20). Each beam segment (20) passes through a microscope objective (22), pinhole (spacial filter) (24), and collimating lens (26) to produce an expanded, collimated beam (28). Each expanded, collimated beam (28) is reflected by a mirror (36) to converge in the plane of photopolymerizable layer (32). The photopolymerizable layer (32) is mounted on a glass plate (34) and protected by a polyethylene terephthalate film support (30).

Figure 2:
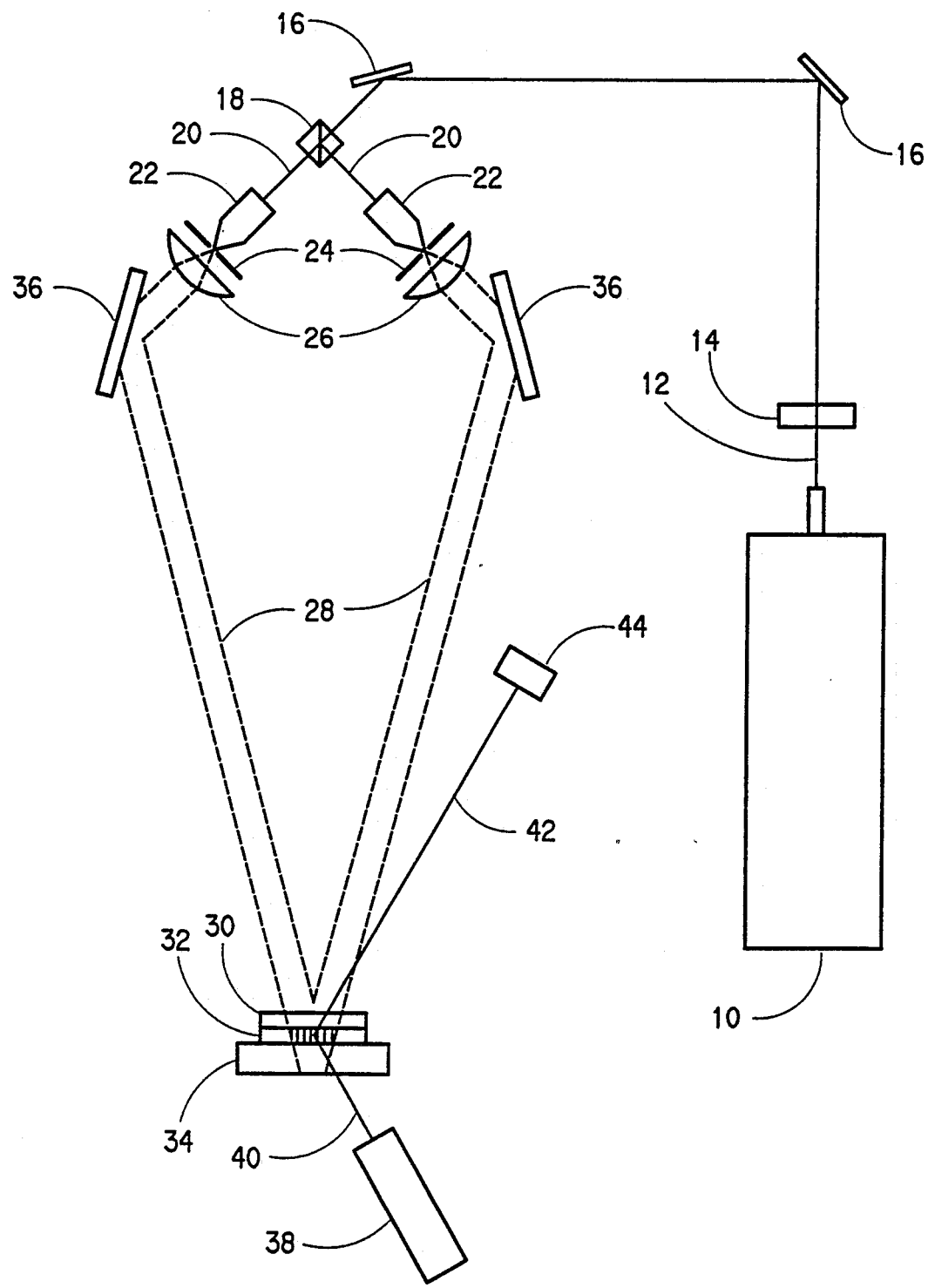
FIG. 2 illustrates the experimental arrangement used to prepare holographic gratings.

For comparison with compositors which contain addition polymerizable monomers which do not polymerize via carbon-carbon sigma-bond cleavage, transmission gratings were prepared and the diffraction efficiency of each determined. This measurement is achieved using the 30° holographic grating system illustrated in FIG. 2. In this system an argon ion laser (10) operating at 488 nm and $TEM_{oo}$ produces a laser beam (12) which is controlled by a shutter (14). The laser beam (12) is directed by mirrors (16) into a beam splitter (18) wherein the beam is divided into two approximately equal beam segments (20). Each beam segment (20) passes through a microscope objective (22), pinhole (spatial filter) (24) and collimating lens (26). The expanded collimated beams (28) are each reflected by a mirror (36) to converge in the plane of glass mounted sample (32) to subtend an angle of 30° whose bisector is normal to the plane of the sample (32) so as to form a grating hologram. The photopolymerizable layer (32) is mounted on a glass plate (34) and protected by a polyethylene terephthalate film support (30). Grating formation is measured in real time by passing a 632.8 nm beam (40) from a He:Ne laser (38) through the center of the exposure area at the Bragg angle and the intensity of the laser beam (42) diffracted by the sample (32) is monitored with a detector (44).

After holographic mirrors or gratings are recorded, the film samples are overall exposed to a mixture of ultraviolet and visible light. THe film support and attached exposed photopolymerizable layer are then removed from the glass plate, and transmission spectra of the unprocessed holographic mirrors are recorded at 400–500 nm using a conventional spectrophotometer. Maximum reflection efficiency is measured from the transmission spectra.

Reflection efficiencies using prior art solid formulations typically are 10% or less whereas the compositors of this invention typically will achieve reflection efficiencies higher than 10%, and as high as approximately 30%, or higher. Because of the excellent efficiencies that are achieved, less material is needed to produce an acceptable hologram.

Substrates/Coating

The improved photopolymerizable compositions of this invention are substantially solid and are typically used as a layer applied to a permanent substrate. The composition may be directly coated onto the substrate by any conventional method or may be laminated thereto as a storage stable, preformed element comprising the photopolymerizable layer releasably adhered to a temporary support film which is dimensionally stable and, preferably, transparent to actinic radiation, e.g., of polyethylene terephthalate. The other side of the supported photopolymerizable layer may have a temporary protective coversheet releasably adhered thereto, e.g., polyethylene, polypropylene, etc. Typically the coversheet has the weaker adherence to the photopolymerizable layer and the permanent substrate has the stronger adherence. Conventional intermediate layers or coatings may be used to facilitate the adhesive and/or release characteristics needed for the preformed element.

Composition

Amounts of ingredients in the photopolymerizable compositions will generally by within the following percentage ranges based on total weight of the photopolymerizable layer: monomer, 5–60%, preferably 15–50%; initiator 0.1–10%, preferably 1–5%: binder, 25–75%, preferably 45–65%; plasticizer, if present, 2–25%, preferably 5–15%; other ingredients 0–5%, preferably 1–4%.

Syntheses

The synthesis of vinylcyclopropanes is discussed in "Ring-Opening Polymerizations via Carbon-Carbon Sigma-Bond Cleavage", by H. K. Hall, Jr., and L. G. Snow, in *Ring-Opening Polymerization*, K. J. Ivin and T. Saegusa, ed., Elsevier, New York, 1984, Chapter 2, pp. 84–85. Vinyl cyclopropane has been prepared from methylcyclopropyl carbinol by acidic dehydration (Van Volkenburgh et al., *J. Am. Chem. Soc.*, 71, 3595, 1949).

In addition to synthetic procedures similar to the one mentioned above, two other general methods are used to prepare vinylcyclopropanes. The addition of carbenes to butadiene, as described, for example, by T. Takahaski, *J. Poly. Sci.*, A-1, 6, 403, 1968, constitutes one such method. A modification of this method is described by Buchert ad Reissig, *Tetrahedron Lett.*, 29, 2318, 1988. The second general method is used to prepare vinylcyclopropanes ring-substituted with two electron-withdrawing groups. These compounds are prepared by reaction of sodium diethylmalonate (or a related compound) with 1,4-dibromo-2-butene as described, for example, by R. W. Kierstead, et al., *J. Chem. Soc.*, 3610-21 (1952). The synthesis of EAVC and of EBVC by this method is described in Examples 1 and 2, respectively.

Industrial Applications

The compositions and processes of this invention are used in the preparation of reflection holograms. Reflection holograms can be used in displays as, for example, in advertising or packaging; in security applications as, for example, on credit cards, bank notes, lottery tickets, and the like; for information storage; and for the preparation of holographic optical elements, i.e., holographic mirrors.

Holographic mirrors have certain advantages over conventional mirrors: (1) they can be produced by a photographic process making them potentially low cost in mass production, (2) the optical configuration is independent of the substrate configuration, (3) they can be spectrally sensitive, performing as narrow band rejection filters, and (4) the physical weight can be insignificant in comparison to that of conventional optics. Important application of holographic mirrors include holographic notch filters and head-up displays.

A notch filter rejects a selected narrow band of radiation and provides maximum transmission outside the selected band. Holographic notch filters provide protection against laser radiation for eyes and for instruments.

A head-up display is a form of optical combiner, i.e., a dual function optical element which simultaneously performs as an optical window (which transmits a nearly undistorted transmitted image) and as an analog of a conventional mirror or lens. A head-up display is comprised of a holographic mirror mounted in front of an observer. When information is projected onto the mirror at the wavelength which the holographic mirror reflects, the observer sees the information projected on the mirror. However, the observer is able to see the outside world through the mirror since the holographic mirror reflects only a narrow band of radiation. Head-up displays are used in aircraft and have been proposed for use in automobiles.

The advantageous properties of this invention can be observed by reference to the following examples which illustrate, but do not limit, the invention.

EXAMPLES

| | Glossary of Chemical Names |
|---|---|
| BHT | Butylated hydroxytoluene; 2,6-Di-tert-butyl-4-methylphenol; CAS 128-37-0 |
| CAB | Cellulose acetate butyrate, Eastman type 531-1; CAS 9004-36-8 |
| DEAW | Cyclopentanone, 2,5-bis[[4-(diethylamino)phenyl]methylene]-; CAS 38394-53-5 |
| EAVC | Ethyl 1-acetyl-2-vinyl-1-cyclopropane carboxylate |
| EBVC | Ethyl 1-benzoly-2-vinyl-1-cyclopropane carboxylate |
| EVCD | Ethyl 2-vinylcyclopropane-1,1-dicarboxylate |
| MBO | 2-Mercaptobenzoxazole; 2-Benzoxazolethiol; CAS 2382-96-9 |
| MMT | 4-Methyl-4H-1,2,4-triazole-3-thiol; CAS 24854-43-1 |
| o-Cl-HABI | 1,1'-Biimidazole, 2,2'-bis[o-chlorophenyl]-4,4',5,5'-tetraphenyl-; CAS 1707-68-2 |
| POEA | 2-Phenoxyethyl acrylate; CAS 48145-04-6 |
| PS-AN | 75:25 poly(styrene/acrylonitrile) |
| PS-MMA | 70:30 Poly(styrene/methyl methacrylate) |
| PVB | Poly(vinyl butyral), M.W. 36,000; CAS 63148-65-2 |
| TDA | Triethyleneglycol diacrylate; CAS-1680-21-3 |
| TDC | Triethyleneglycol dicaprylate; CAS-106-10-5 |

GENERAL PROCEDURES

Sample Preparation

Coating solutions without visible sensitizer, DEAW, were prepared under yellow or red light. After addition of DEAW, all operations on solution and their resulting coatings were performed under red light only. To further protect them from actinic light, all solutions were prepared and stored in amber bottles. SOlutions were prepared by adding components to the solvent and mixing with a mechanical stirrer until they completely dissolved. Except for TDA and POEA, which were chromotographed on aluminum oxide (activity 1) prior to use all components were used as received from the suppliers.

Solutions were coated onto a 4-mil clear film support of polyethylene terephthalate (Mylar ® polyethylene terephthalate film) at a speed of 8 ft/min using a Talboy coater equipped with a 8 mil doctor knife, 12 ft drier set at 40°-50° C., and a laminator station. A cover sheet 0.9 mil polyethylene terephthalate was laminated to the coatings as they emerged from the drier. Coating samples were stored in black polyethylene bags at room temperature until used.

Sample Evaluation

Coated film was cut into 4×5-inch sections, the cover sheet wad removed, and the film then mounted by laminating the tacky coating directly to a glass plate with hand-held roller. The 4-mil polyethylene terephthalate film support was left in place during exposure and handling.

Coatings mounted on glass plates were evaluated by recording holographic mirrors and determining their reflection efficiency as a function of wavelength. The mirror were formed by actinic exposure at the intersection of two counterpropagating beams of an argon-ion laser operating at 488 nanometeres, TEM$_{00}$ mode (see FIG. 1). The beam intensity ratio was maintained at 1:1, with absolute intensities ranging from 2-4 mW/cm$^2$ per beam. Beam diameter was about one centimeter. Exposure times ranged from 30 sec to several minutes, corresponding to 150-1000 mJ/cm$^2$ total exposure. About one minute after imagewise exposure, each holographic mirror was given a 30-60 sec fixing exposure using one of the two 488 nm beams. The plate was then overall exposed to ultraviolet and visible light using the output of a Theimer-Strahler #5027 mercury-arc photopolymer lamp (Exposure Systems Corp., Bridgeport, CT) mounted in a Douthitt DCOP-X (Douthitt Corp., Detroit, MI) exposure unit. The coating and attached film support was then removed for analysis. Transmission spectra of the holographic mirrors were recorded from 400–550 nm on a Hitachi Perkin-Elmer model 330 spectrophotometer. Maximum reflection efficiency was measured from the transmission spectra. Coating thickness was determined from photocured samples using either a Sloan Dektak 3030 surface profile monitoring system or a Brown and Sharpe model 1020 Electronic Comparator.

Coatings mounted on glass plates were also evaluated by recording diffraction gratings and determining their diffraction efficiency. The glass mounted photopolymerizable layer were evaluated in the 30° holographic grating system described in FIG. 2. The beam intensity ratio was maintained at about 1:1, with absolute intensities of each beam ranging from 3–10 mW/cm² per beam. The diameter of each beam was about 1 cm. The photopolymerizable layer was exposed for about 4–8 seconds to the modulated laser radiation corresponding to about 50–100 mJ/cm² total exposure. About one minute after this image-wise exposure the grating was reexposed for 1–2 min using one of the two emerging beams to fix or complete polymerization throughout the photopolymerizable layer. Grating formation was monitored using the non-actinic 632.8 nm beam of a He:Ne laser and a detector which is a Coherent model 212 power meter attached to a strip chart recorder. Diffraction efficiency (n) is calculated as the ratio of the diffracted beam intensity ($I_{diff}$) to the pre-exposure undiffracted beam intensity ($I_o$) after passing through the coating:

$$n = I_{diff}/I_o \quad (1)$$

The samples were exposed to ultraviolet and visible radiation and coating thicknesses measured as described above.

EXAMPLE 1

Synthesis of EAVC

A 500 mL three-necked round-bottomed flask equipped with an addition funnel and magnetic stirrer was charged with 150 mL of anhydrous ethanol. Sodium (6.45 gm, 280 mmol) was added in small pieces with stirring. When all the sodium had dissolved, ethyl acetoacetate (18.2 gm, 140 mmol) and 10 mL of ethanol were added dropwise. After stirring for a few minutes, a slurry of 1,4-dibromobutene (30.0 gm, 140 mmol) in 10 mL of ethanol was added over about 1 min. An exothermic reaction ensued with the precipitation of a white solid. The resulting white suspension was stirred at room temperature for 24 hr. The reaction mixture was filtered to remove the precipitated sodium bromide and the bulk of the ethanol removed by rotary evaporation. The resulting slurry was taken up with 200 mL of ether and filtered again. The ether was removed by rotary evaporation and the product was purified by vacuum distillation. The fraction with a bp of 52–58° C. @0.5 mmHg was collected to vive 12.8 gm (51% yield) of EVAC as a clear colorless oil. Proton NMR indicated a 60:40 mixture of stereoismers. Refractive index = 1.4654.

EXAMPLE 2

Synthesis of EBVC

To a 2 L three-necked round-bottomed flask equipped with an addition funnel and magnetic stirrer was added a slurry of 1,4-dibromobutene (106.0 gm, 500 mmol) in 200 mL of anhydrous ethanol. A solution of sodium ethyl benzoylacetate, prepared by the addition of ethyl benzoylacetate (96.8 gm, 500 mmol) to a solution of sodium ethoxide in ethanol (11.5 gm of sodium dissolved in 300 mL of ethanol), was added over 0.5 hr. An exothermic reaction ensured with the precipitation of white solid. After stirring for 10 min., a solution of sodium ethoxide (11.5 gm of sodium dissolved in 220 mL of ethanol) was added over 15 min. The resulting white suspension was stirred for 4 hr and allowed to stand at room temperature overnight. The reaction mixture was filtered to remove the precipitated sodium bromide and the bulk of the ethanol removed by rotary evaporation. The resulting slurry was taken up with 200 mL of ether and filtered again. The ether was removed by rotary evaporation and the product was purified by vacuum distillation. The fraction with a bp of 95°–100° C. @0.04–0.01 mmHg was collected to give 69.3 gm (57% yield) of EVBC as a clear colorless oil. Proton NMR indicated a 50:50 mixture of stereoismers. Refractive index = 1.5313.

CONTROL EXAMPLES A–C

The control compositions contain TDA for POEA acrylic monomers in either PS-MMA, PVB, or CAB binder. Formulations A–C were prepared, coated, exposed to form holographic mirrors and gratings, and analyzed as described in the general procedures above. Example A is a binder orientated system; Examples B and C are monomer orientated systems. Results are given in the following table.

| INGREDIENT (gm) | A | B | C |
| --- | --- | --- | --- |
| Dichloromethane | 75.0 | 72.0 | 36.0 |
| Methanol | — | 8.0 | 4.0 |
| PS-MMA | 15.0 | — | — |
| PVB | — | 10.19 | — |
| CAB | — | — | 5.09 |
| o-Cl HABI | 0.50 | 0.40 | 0.20 |
| MBO | 0.50 | — | — |
| MMT | — | 0.40 | 0.20 |
| TDA | 9.00 | — | — |
| POEA | — | 7.00 | 3.50 |
| TDC | — | 2.00 | 1.00 |
| DEAW | 0.025 | 0.010 | 0.0060 |
| BHT | 0.0025 | 0.002 | 0.001 |
| DRY COATING THICKNESS, Microns | 44 | 24 | 22 |
| REFLECTION EFFICIENCY, Maximum | 8.3% | 10.6% | 3.9% |
| DIFFRACTION EFFICIENCY, Maximum | 93.3% | 95.5% | 89.3% |

EXAMPLE 3

This is a binder oriented system containing EVCD monomer and PS-MMA binder.

The composition was prepared, coated, exposed to form a holographic mirror and a holographic transmission grating, and analyzed as described above. Results are given in the following table. Although holographic transmission graftings prepared from this composition and from the composition in Control Example A and comparable diffraction efficiencies, the reflection hologram made with this composition had greater reflection efficiency than the one prepared from in Control Example A.

EXAMPLES 4-5

These are monomer oriented systems containing EBVC monomer with either PVB or CAB binder.

Formulations 4 and 5 were prepared, coated, exposed to form holographic mirrors and transmission gratings, and analyzed as described above. Results are given in the following table. Although diffraction gratings prepared from these compositions were less efficient than those prepared from control compositions B and C, respectively, reflection holograms made with these compositions have greater reflection efficiency than holograms prepared from the control compositions.

EXAMPLE 6

This is a binder orientated system containing EAVC monomer and PS-MMA binder.

The composition was prepared, coated, exposed to form a holographic mirror and a holographic transmission grating, and analyzed as described above. Results are given in the following table.

EXMAPLE 7

This is a binder oriented system containing EVCD monomer and PS-AN binder.

The composition was prepared, coated, exposed to form a holographic mirror and a holographic transmission grating, and analyzed as described above. Results are given in the following table.

TABLE 2

| INGREDIENT (gm) | 3 | 4 | 5 | 6 | 7 |
| --- | --- | --- | --- | --- | --- |
| Dichloromethane | 75.0 | 72.0 | 72.0 | 37.5 | 75.0 |
| Methanol | — | 8.0 | 8.0 | — | — |
| PS-MMA | 15.0 | — | — | 7.50 | — |
| PS-AN | — | — | — | — | 16.5 |
| PVB | — | 10.19 | — | — | — |
| CAB | — | — | 10.19 | — | — |
| o-Cl HABI | 0.50 | 0.40 | 0.40 | 0.25 | 1.0 |
| MBO | 0.50 | — | — | 0.25 | 0.50 |
| MMT | — | 0.40 | 0.40 | — | — |
| EVCD | 9.00 | — | — | — | 7.5 |
| EBVC | — | 7.00 | 7.00 | — | — |
| EAVC | — | — | — | 4.50 | — |
| TDC | — | 2.00 | 2.00 | — | — |
| DEAW | 0.025 | 0.010 | 0.012 | 0.00625 | 0.0125 |
| BHT | 0.0025 | 0.0020 | 0.0020 | 0.00125 | 0.00125 |
| DRY COATING THICKNESS, Microns | 29 | 25 | 24 | 27 | 32 |
| REFLECTION EFFICIENCY, Maximum | 25.5% | 31.2% | 7.9% | 4.9% | 23.1% |
| DIFFRACTION EFFICIENCY, Maximum | 89.2% | 57.0% | 6.5% | 13.3% | 53.0% |

Having described the invention, we claim:

1. A substantially solid composition that contains a volume reflection hologram formed by exposing to actinic radiation a composition consisting essentially of:
   (a) 25 to 75% of a solvent soluble, thermoplastic polymeric binder;
   (b) 5 to 60% of a monomer capable of addition polymerization, said monomer having a boiling point above 100° C. and polymerizing via free radical ring-opening sigma-bond cleavage; and
   (c) 0.1 to 10% of a photoinitiator system that activates free radical polymerization of said monomer on exposure to actinic radiation;

wherein said percentages are weight percentages of the total composition.

2. The composition of claim 1 wherein said monomer contains a ring selected from the group consisting of carbocyclic rings of up to seven carbon atoms and heterocyclic rings of up to seven atoms containing up to two heteroatoms wherein said heteroatoms are selected from the group consisting of nitrogen, oxygen, and sulfur.

3. The composition of claim 1 wherein said monomer contains a heterocyclic ring of up to five atoms containing up to two heteroatoms selected from the group consisting of nitrogen, oxygen, and sulfur.

4. The composition of claim 1 wherein said monomer is a vinylcyclopropane.

5. The composition of claim 4 wherein said vinyl group is unsubstituted and at least one electron-withdrawing group is attached to the cyclopropane ring.

6. The composition of claim 4 wherein said monomer is selected from the group consisting of diethyl 2-vinylcyclopropane-1,1-dicarboxylate; ethyl 1-acetyl-2-vinyl-1-cyclopropane carboxylate; and ethyl-1-benzoyl-2-vinyl-1-cyclopropane carboxylate; and mixtures thereof.

7. The composition of claim 1 wherein the composition has a reflection efficiency of at least 10% after imaging.

8. The composition of claim 1 wherein said binder or monomer contains one or more moieties selected from the group consisting of substituted or unsubstituted phenyl, phenoxy, naphthyl, naphthyloxy, heteroaromatic groups containing up to three aromatic rings, chlorine, and bromine, and the other is substantially free of said moieties.

9. The composition of claim 8 wherein said monomer contains said moiety, and said binder is substantially free of said moiety.

10. The composition of claim 9 wherein the monomer is a substituted vinylcyclopropane.

11. The composition of claim 10 wherein the binder is selected from the group consisting of cellulose acetate butyrate polymers, acrylic polymers and interpolymers, methyl methacrylate polymers and copolymers, polyvinyl acetate, polyvinyl acetal, polyvinyl butyral, polyvinyl formal, and mixtures thereof.

12. The composition of claim 8 wherein said binder contains said moiety, and said monomer is substantially free of said moiety.

13. The composition of claim 12 wherein the monomer is a vinylcyclopropane.

14. The composition of claim 13 wherein the binder is selected from the group consisting of polystyrene, poly(styrene/acrylonitrile), poly(styrene/methyl methacrylate), polyvinyl benzal, and mixtures thereof.

15. The composition of claim 8 wherein a plasticizer is present in an amount up to approximately 25% by weight of the total composition.

16. An element comprising a substrate that supports a volume reflection hologram formed by exposing to actinic radiation a substantially solid, photopolymerizable composition consisting essentially of:
   (a) 25 to 75% of a solvent soluble, thermoplastic polymeric binder;
   (b) 5 to 60% of a monomer capable of addition polymerization, said monomer having a boiling point above 100° C. and polymerizing via free radical ring-opening sigma-bond cleavage; and
   (c) up to 25% of a plasticizer; and (d) 0.1 to 10% of a photoinitiator system that activates free radical polymerization of said monomer on exposure to actinic radiation;

wherein said percentages are weight percentages of the total composition.

17. The element of claim 16 wherein said monomer contains a ring selected from the group consisting of carbocyclic rings of up to seven carbon atoms and heterocyclic rings of up to seven atoms containing up to two heteroatoms selected from the group consisting of nitrogen oxygen, and sulfur.

18. The element of claim 16 wherein said monomer contains a heterocyclic ring of up to vie atoms containing up to two heteroatoms selected from the group consisting of nitrogen, oxygen, and sulfur.

19. The element of claim 16 wherein said monomer is a vinylcyclopropane.

20. The element of claim 19 wherein said vinyl group is unsubstituted and at least one electron-withdrawing group is attached to the cyclopropane ring.

21. The element of claim 19 wherein said monomer is selected from the group consisting of diethyl 2-vinylcyclopropane-1,1-dicarboxylate; ethyl 1-acetyl-2-vinyl-1-cyclopropane carboxylate; and ethyl-1-benzoyl-2-vinyl-1-cyclopropane carboxylate; and mixtures thereof.

22. The element of claim 16 wherein the composition has a reflection efficiency of at least approximately 10% after imaging and the coating components are present in the following approximate amounts: binder, 45 to 65%; monomer, 15 to 50%; plasticizer, 5 to 15%; and initiator, 1 to 5%.

23. The element of claim 22 wherein the binder or monomer contains one or more moieties selected from the group consisting of substituted or unsubstituted phenyl, phenoxy, naphthyl, naphthyloxy, heteroaromatic groups containing up to three aromatic rings, chlorine, and bromine, and the other is substantially free of said moieties.

24. The element of claim 23 wherein said monomer contains said moiety, and said binder is substantially free of said moiety.

25. The element of claim 24 wherein the monomer is a substituted vinylcyclopropane.

26. The element of claim 25 wherein the binder is selected from the group consisting of cellulose acetate butyrate polymers, acrylic polymers and interpolymers, methyl methacrylate polymers and copolymers, polyvinyl acetate, polyvinyl acetal, polyvinyl butyral, polyvinyl formal, and mixtures thereof.

27. The element of claim 23 wherein said binder contains said moiety, and said monomer is substantially free of said moiety.

28. The element of claim 27 wherein the monomer is a vinylcyclopropane.

29. The element of claim 28 wherein the binder is selected from the group consisting of polystyrene, poly(styrene/acrylonitrile), poly(styrene/methyl methacrylate), polyvinyl benzal, and mixtures thereof.

* * * * *